United States Patent
Kim et al.

(10) Patent No.: US 11,193,217 B2
(45) Date of Patent: Dec. 7, 2021

(54) SILICON-BASED MOLTEN COMPOSITION AND METHOD FOR MANUFACTURING SILICON CARBIDE SINGLE CRYSTAL USING THE SAME

(71) Applicant: LG Chem, Ltd., Seoul (KR)

(72) Inventors: Junghwan Kim, Daejeon (KR); Ho Rim Lee, Daejeon (KR); Chan Yeup Chung, Daejeon (KR); Jung Min Ko, Daejeon (KR); Manshik Park, Daejeon (KR)

(73) Assignee: LG Chem, Ltd.

( * ) Notice: Subject to any disclaimer, the term of this patent is extended or adjusted under 35 U.S.C. 154(b) by 26 days.

(21) Appl. No.: 16/493,147

(22) PCT Filed: Nov. 1, 2018

(86) PCT No.: PCT/KR2018/013200
§ 371 (c)(1),
(2) Date: Sep. 11, 2019

(87) PCT Pub. No.: WO2019/088740
PCT Pub. Date: May 9, 2019

(65) Prior Publication Data
US 2020/0080226 A1   Mar. 12, 2020

(30) Foreign Application Priority Data

Nov. 3, 2017  (KR) ........................ 10-2017-0146280
Oct. 11, 2018  (KR) ........................ 10-2018-0121270

(51) Int. Cl.
*C30B 29/36*   (2006.01)
*C30B 15/36*   (2006.01)
(Continued)

(52) U.S. Cl.
CPC .............. *C30B 15/36* (2013.01); *C30B 29/06* (2013.01); *C30B 29/36* (2013.01); *H01L 29/04* (2013.01); *H01L 29/1608* (2013.01)

(58) Field of Classification Search
CPC ......... C30B 11/08; C30B 19/02; C30B 19/04; C30B 29/36
See application file for complete search history.

(56) References Cited

U.S. PATENT DOCUMENTS

| | | | |
|---|---|---|---|
| 9,732,437 | B2 | 8/2017 | Shirai |
| 2003/0180579 | A1* | 9/2003 | Waggoner ............. C22C 1/1005 428/698 |

(Continued)

FOREIGN PATENT DOCUMENTS

| | | |
|---|---|---|
| CN | 1863945 A | 11/2006 |
| CN | 104695007 A | 6/2015 |

(Continued)

OTHER PUBLICATIONS

International Search Report for Application No. PCT/KR2018/013200, dated Apr. 8, 2019, pp. 1-2.

(Continued)

*Primary Examiner* — Robert M Kunemund
(74) *Attorney, Agent, or Firm* — Lerner, David, Littenberg, Krumholz & Mentlik, LLP

(57) ABSTRACT

A silicon-based molten composition according to an exemplary embodiment of the present invention is used in a solution growing method for forming silicon carbide single crystal, and is expressed in Formula 1 including silicon (Si), chromium (Cr), vanadium (V), and aluminum (Al).

$$Si_aCr_bV_cAl_d$$ [Formula 1]

In Formula 1, a is equal to or greater than 0.4 and equal to or less than 0.9, b+c is equal to or greater than 0.1 and equal to or less than 0.6, c/(b+c) is equal to or greater than 0.05 and (Continued)

equal to or less than 0.95, and d is equal to or greater than 0.01 and equal to or less than 0.1.

10 Claims, 5 Drawing Sheets

(51) Int. Cl.
    *C30B 29/06*     (2006.01)
    *H01L 29/16*     (2006.01)
    *H01L 29/04*     (2006.01)

(56) References Cited

U.S. PATENT DOCUMENTS

| | | |
|---|---|---|
| 2006/0292057 A1 | 12/2006 | Nakamura |
| 2014/0189504 A1* | 7/2014 | Schwartz ............. G06Q 10/101 715/273 |
| 2015/0159297 A1* | 6/2015 | Shinya .................... C30B 11/08 117/35 |
| 2015/0159299 A1 | 6/2015 | Shinya et al. |
| 2015/0167197 A1* | 6/2015 | Ujihara .................. C30B 29/36 423/345 |
| 2016/0273126 A1 | 9/2016 | Kusunoki et al. |
| 2018/0127891 A1 | 5/2018 | Chung et al. |
| 2018/0230623 A1 | 8/2018 | Shinya et al. |

FOREIGN PATENT DOCUMENTS

| | | |
|---|---|---|
| JP | 2007261843 A | 10/2007 |
| JP | 2008100890 A | 5/2008 |
| JP | 2012111669 A | 6/2012 |
| JP | 2015110495 A | 6/2015 |
| JP | 2016056079 A | 4/2016 |
| JP | 2016172674 A | 9/2016 |
| JP | 2016172677 A | 9/2016 |
| JP | 2016204188 A | 12/2016 |
| JP | 2017031034 A | 2/2017 |
| KR | 20120057536 A | 6/2012 |
| KR | 20150066459 A | 6/2015 |
| KR | 20150142245 A | 12/2015 |
| KR | 20160078343 A | 7/2016 |
| KR | 20170048216 A | 5/2017 |
| KR | 20170103289 A | 9/2017 |

OTHER PUBLICATIONS

Chinese Search Report for Application No. 201880021421.9 dated Nov. 4, 2020, 2 pages.

* cited by examiner

SILICON-BASED MOLTEN COMPOSITION AND METHOD FOR MANUFACTURING SILICON CARBIDE SINGLE CRYSTAL USING THE SAME

CROSS-REFERENCE TO RELATED APPLICATIONS

This application is a national phase entry under 35 U.S.C. § 371 of International Application No. PCT/KR2018/013200, filed Nov. 1, 2018, which claims priority to Korean Patent Application No. 10-2017-0146280, filed Nov. 3, 2017, and Korean Patent Application No. 10-2018-0121270, filed Oct. 11, 2018, the disclosures of which are incorporated herein by reference.

BACKGROUND OF THE INVENTION

The present invention relates to a silicon-based molten composition, and a method for manufacturing silicon carbide single crystal using the same.

An electrical power semiconductor device is a key device for a next-generation system using electrical energy, such as an electric vehicle and an electric power system, or for radio frequency mobile communication. For this purpose, it is required to select a material that is appropriate for high voltage, high current, and radio frequency. Silicon single crystal has been used as an electrical power semiconductor material, but because of a limit of the physical property, silicon carbide single crystal that has a small energy loss and may be driven under more extreme conditions is being paid high attention.

To grow the silicon carbide single crystal, for example, a sublimation method using silicon carbide as a base material and sublimating the same at a high temperature that is equal to or greater than 2000 degrees (° C.) to grow the single crystal, a solution growing method for applying a crystal pulling method, and a chemical vapor deposition method using a gas source may be used.

In the case of using the chemical vapor deposition method, it may be allowed to grow to a thickness-limited thin membrane level, and in the case of using the sublimation method, defects such as micropipes or stacking errors may be generated, so there is a limit in the viewpoint of production costs. Studies on the solution growing method that has a crystal growing temperature that is lower than that of the sublimation method, and is advantageous in widening and high quality, are in progress.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a silicon-based molten composition for reducing a processing time and cost by providing a fast crystal growing speed. The present invention has been made in another effort to provide a silicon-based molten composition for providing silicon carbide single crystal with excellent quality. The present invention has been made in another effort to provide a method for manufacturing silicon carbide single crystal using the silicon-based molten composition.

The technical objects to be achieved by the present invention are not limited to the above-mentioned technical objects. That is, other technical objects that are not mentioned may be obviously understood by those skilled in the art to which the present invention pertains from the following description.

An exemplary embodiment of the present invention provides a silicon-based molten composition used in a solution growing method for forming silicon carbide single crystal, and expressed in Formula 1 including silicon (Si), chromium (Cr), vanadium (V), and aluminum (Al).

$$Si_aCr_bV_cAl_d \quad \text{[Formula 1]}$$

In Formula 1, a is equal to or greater than 0.4 and equal to or less than 0.9, b+c is equal to or greater than 0.1 and equal to or less than 0.6, c/(b+c) is equal to or greater than 0.05 and equal to or less than 0.95, and d is equal to or greater than 0.01 and equal to or less than 0.1.

In Formula 1, a may be equal to or greater than 0.5 and equal to or less than 0.8, b+c may be equal to or greater than 0.2 and equal to or less than 0.5, c/(b+c) may be equal to or greater than 0.1 and equal to or less than 0.9, and d may be equal to or greater than 0.01 and equal to or less than 0.05.

The silicon-based molten composition may have carbon solubility that is equal to or greater than 0.04 at a temperature of 1800 degrees (° C.).

The silicon-based molten composition may have carbon solubility that is equal to or greater than 0.06 at a temperature of 1900 degrees (° C.).

A content ratio of the chromium and the vanadium may be 9:1 to 1:9.

Another embodiment of the present invention provides a method for manufacturing a silicon carbide single crystal, including: preparing a silicon carbide seed crystal; preparing a silicon-based molten composition including silicon (Si), chromium (Cr), vanadium (V), and aluminum (Al) and expressed in Formula 1; forming a molten solution by adding carbon (C) to the silicon-based molten composition; and growing silicon carbide single crystal on the seed crystal by overcooling the molten solution.

$$Si_aCr_bV_cAl_d \quad \text{[Formula 1]}$$

In Formula 1, a is equal to or greater than 0.4 and equal to or less than 0.9, b+c is equal to or greater than 0.1 and equal to or less than 0.6, c/(b+c) is equal to or greater than 0.05 and equal to or less than 0.95, and d is equal to or greater than 0.01 and equal to or less than 0.1.

The silicon-based molten composition according to an exemplary embodiment may reduce the processing time and cost by providing a fast crystal growing speed. Further, silicon carbide single crystal with excellent quality may be provided.

DETAILED DESCRIPTION OF THE EMBODIMENTS

Figure 1:
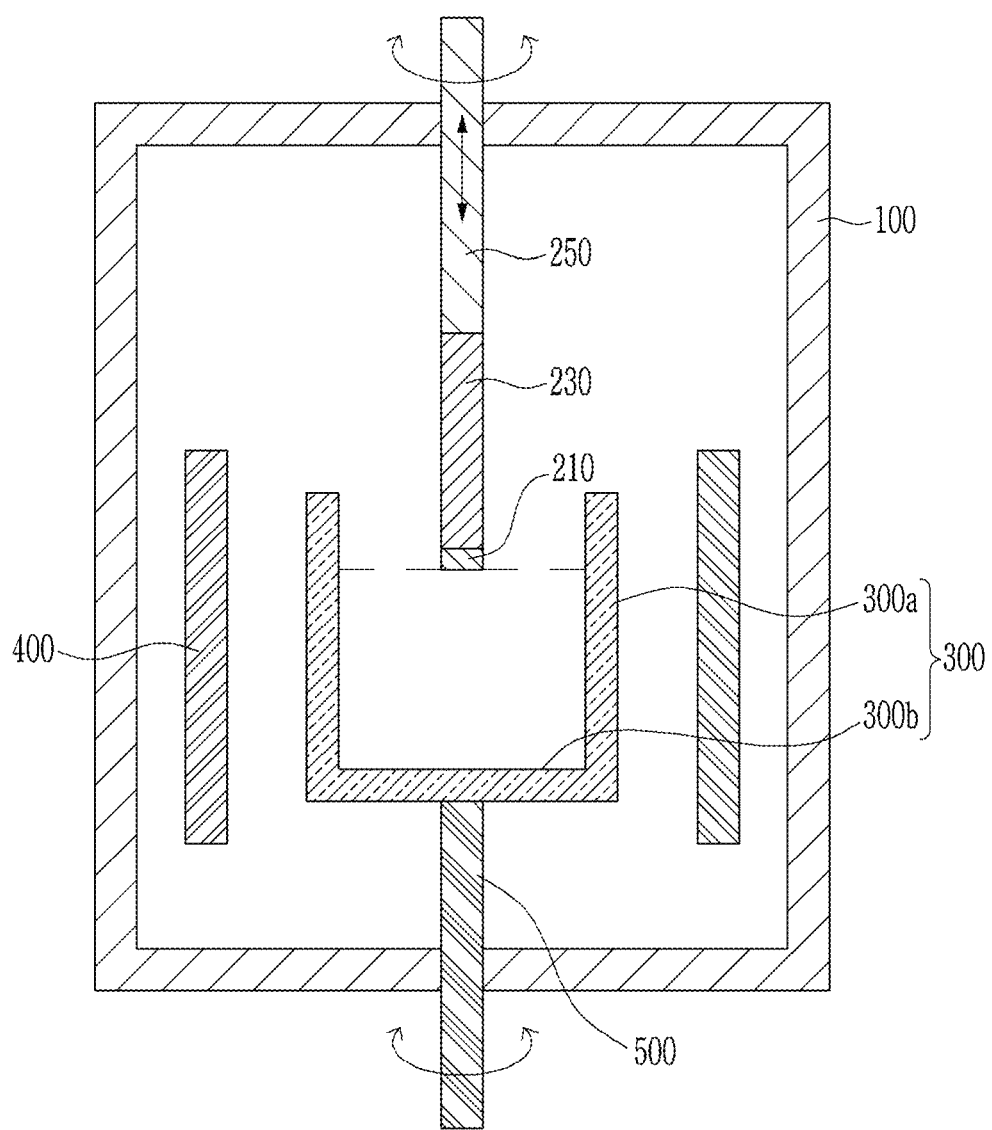
FIG. 1 shows a cross-sectional view of a device for manufacturing silicon carbide single crystal according to an exemplary embodiment.

Exemplary embodiments of the present invention will be described in detail with reference to the accompanying drawings. In describing the present invention, a description of known functions or configurations will be omitted so as to make the subject matter of the present invention more clear.

To clearly describe the present invention, portions which do not relate to the description are omitted, and like reference numerals designate like elements throughout the specification. The size and thickness of each component shown in the drawings are arbitrarily shown for better understanding and ease of description, but the present invention is not limited thereto.

In the drawings, the thickness of layers, films, panels, regions, etc., are exaggerated for clarity. For better understanding and ease of description, the thicknesses of some layers and areas are exaggerated. It will be understood that when an element such as a layer, film, region, or substrate is referred to as being "on" another element, it can be directly on the other element or intervening elements may also be present.

A silicon-based molten composition according to an exemplary embodiment will now be described.

The silicon-based molten composition according to an exemplary embodiment may include silicon (Si), chromium (Cr), vanadium (V), and aluminum (Al). The silicon-based molten composition may be expressed as Formula 1.

$$Si_a Cr_b V_c Al_d \quad \text{[Formula 1]}$$

In Formula 1, a may be equal to or greater than 0.4 and equal to or less than 0.9, b+c may be equal to or greater than 0.1 and equal to or less than 0.6, c/(b+c) may be equal to or greater than 0.05 and equal to or less than 0.95, and d may be equal to or greater than 0.01 and equal to or less than 0.1. a+b+c+d is 1.

More preferably, in Formula 1, a may be equal to or greater than 0.5 and equal to or less than 0.8, b+c may be equal to or greater than 0.2 and equal to or less than 0.5, c/(b+c) may be equal to or greater than 0.1 and equal to or less than 0.9, and d may be equal to or greater than 0.01 and equal to or less than 0.05.

In other words, a content of silicon in the silicon-based molten composition may be equal to or greater than 50 at % and equal to or less than 80 at %. A summation of contents of chromium and vanadium may be equal to or greater than 20 at % and equal to or less than 50 at %. Further, a content of aluminum may be equal to or greater than 1 at % and equal to or less than 5 at %.

When the contents of chromium and vanadium that are less than the above-noted condition are included, solubility of carbon on the silicon-based molten composition is reduced, so a growing speed of silicon carbide single crystal may be substantially reduced. An effect of improving the solubility of carbon on the silicon-based molten composition may be weak.

In another way, when the contents of chromium and vanadium that are greater than the above-noted condition are included, a compound of a metal and silicon may be produced, or the carbon existing in the silicon-based molten solution may be precipitated in a graphite or metal carbide form and not in a silicon carbide form. Further, the carbon solubility at the corresponding temperature and a carbon solubility difference caused by a difference of temperatures increase, so a driving force for producing a silicon carbide may be substantially increased. In this case, the silicon carbide is polycrystallized and quality of the silicon carbide crystal may be deteriorated.

The aluminum (Al) may be included at a content that is equal to or greater than 1 at % and equal to or less than 10 at %, preferably equal to or greater than 1 at % and equal to or less than 5 at %, in the silicon-based molten composition expressed in Formula 1.

The aluminum (Al) may improve crystallinity of silicon carbide single crystal obtained by suppressing production of polycrystals in the process for growing silicon carbide single crystal. The aluminum (Al) provides a uniform crystalline nucleus over the entire growing surface of the silicon carbide single crystal. Accordingly, the silicon carbide single crystal having a planar shape may be obtained. When the growing surface includes a non-uniform crystalline nucleus, polycrystalline silicon carbide grows.

The silicon-based molten composition according to an exemplary embodiment may obtain the silicon carbide single crystal with excellent quality by including predetermined contents of silicon (Si); chromium (Cr) and vanadium (V) for increasing a carbon solubility difference caused by a molten solution temperature, and a carbon solubility value at a corresponding temperature, and stabilizing the carbon in the molten solution; and aluminum (Al) for improving crystallinity of the silicon carbide single crystal. Further, the silicon-based molten composition according to an exemplary embodiment may provide a fast single crystal growing speed, thereby reducing the time and expense for obtainment.

A method for obtaining a silicon carbide single crystal by using the above-described silicon-based molten composition will now be described with reference to the manufacturing device shown in FIG. 1. FIG. 1 shows a cross-sectional view of a manufacturing device used when growing silicon carbide single crystal.

Referring to FIG. 1, the silicon carbide single crystal manufacturing device according to an exemplary embodiment may include a reaction chamber 100, a crucible 300 provided in the reaction chamber 100, seed crystal 210 extending into the crucible 300, a seed crystal supporting unit 230 connected to the seed crystal 210, and a heating member 400 for heating a moving member 250 and the crucible 300.

The reaction chamber 100 has a closed and sealed shape including an empty internal space, and its internal portion may be maintained with an atmosphere such as a constant pressure. Although not shown, a vacuum pump and a gas tank for controlling the atmosphere may be connected to the reaction chamber 100. When the inside of the reaction chamber 100 is made to be in the vacuum state by using the vacuum pump and the gas tank for controlling the atmosphere is included, an inert gas such as argon gas may be charged therein.

The silicon carbide seed crystal 210 may be connected to the seed crystal supporting unit 230 and the moving member 250 and may be provided inside the crucible 300, and particularly it may be disposed to contact a molten solution provided inside the crucible 300. The molten solution may include the above-noted silicon-based molten composition.

According to an exemplary embodiment, a meniscus may be formed between the surface of the silicon carbide seed crystal 210 and the molten solution. The meniscus represents a curved side that is formed on the molten solution by a surface tension generated when a lower side of the silicon carbide seed crystal 210 contacts the molten solution and is then slightly lifted up. When the meniscus is formed to grow the silicon carbide single crystal, generation of polycrystals is suppressed to obtain high-quality mono-crystal.

The silicon carbide seed crystal 210 is made of a silicon carbide single crystal. A crystal structure of the silicon carbide seed crystal 210 corresponds to the crystal structure of the silicon carbide single crystal to be manufactured. For example, in the case of manufacturing a 4H polytype silicon carbide single crystal, 4H polytype silicon carbide seed crystal 210 may be used. In the case of using a 4H polytype silicon carbide seed crystal 210, a crystal growing side may be a side (0001) or a side (000-1), or a side that is slanted at equal to or less than 8 degrees from the side (0001) or the side (000-1).

The seed crystal supporting unit 230 connects the silicon carbide seed crystal 210 and the moving member 250. The seed crystal supporting unit 230 includes a first end connected to the moving member 250 and a second end connected to the seed crystal 210.

The seed crystal supporting unit 230 may be connected to the moving member 250, and may move in up and down directions along a height direction of the crucible 300. In detail, the seed crystal supporting unit 230 may be moved inside the crucible 300 for the process for growing silicon carbide single crystal, or it may be moved outside the crucible 300 after the process for growing silicon carbide single crystal is completed. Further, the present specification has described the example in which the seed crystal supporting unit 230 moves in the up and down directions, and without being limited to this, it may move or rotate in any directions, and it may include means known to a skilled person in the art.

The seed crystal supporting unit 230 may be mounted to the moving member 250. To obtain the silicon carbide single crystal, the seed crystal supporting unit 230 may be combined to the moving member 250 and may be provided into the crucible 300, and it may be separated from the moving member 250 when the single crystal growing process is finished.

The moving member 250 may be connected to a driver (not shown), and may be moved into or rotated in the chamber 100. The moving member 250 may include a means known to a skilled person in the art so as to move up and down or rotate.

The crucible 300 may be installed in the reaction chamber 100, it may have a vessel shape of which an upper side is opened, and it may include an external circumferential surface 300a and a lower side 300b excluding the upper side. The crucible 300 allows any shapes for forming the silicon carbide single crystal, without being limited to the above-described shapes. The crucible 300 may be received by inputting a molten base material such as silicon or silicon carbide powder.

The crucible 300 may be made of a material including carbon such as graphite or silicon carbide, and the crucible 300 with such a material may be applied as a source of the carbon base material. In another way, without being limited to this, a crucible with a ceramic material may be used, and in this instance, a material or a source for supplying carbon may be additionally provided.

The heating member 400 may fuse or heat the material received in the crucible 300 by heating the crucible 300. The heating member 400 may use a resistance type of heating means or an inductive heating type of heating means. In detail, the heating member 400 may be formed as a self-heating resistance type, or the heating member 400 may be formed with an induction coil and a radio frequency current is allowed to flow through the induction coil, so the crucible 300 may be formed as an inductive heating type. However, without being limited to the above-described method, any kinds of heating members are usable.

The device for manufacturing a silicon carbide according to an exemplary embodiment may further include a rotating member 500. The rotating member 500 may be combined to a lower side of the crucible 300 and may rotate the crucible 300. The molten solution with a uniform composition may be provided by the rotation of the crucible 300, so high-quality silicon carbide single crystal may grow on the silicon carbide seed crystal 210.

A method for manufacturing silicon carbide single crystal using the above-described device for manufacturing a silicon-based molten composition and silicon carbide single crystal will now be described.

An initial molten base material including the above-described silicon-based molten composition is input to the crucible 300. The initial molten base material may be a powder, but is not limited thereto. When the crucible 300 includes a carbon material, the initial molten base material may not additionally include carbon, and without being limited thereto, the initial molten base material may include carbon.

The crucible 300 to which the initial molten base material is supplied is heated by using the heating member 400 under a noble atmosphere such as argon gas. As heated, the initial molten base material in the crucible 300 is changed to the molten solution including carbon (C), silicon (Si), and a metal (chromium, vanadium, or aluminum).

When the crucible 300 reaches a predetermined temperature, an oversaturated state of the silicon carbide is induced by a difference between the temperature of the molten solution in the crucible 300 and the temperature around the seed crystal 210. The silicon carbide single crystal grows on the seed crystal 210 with the oversaturation as a driving force.

As the silicon carbide single crystal grows, a condition for precipitating a silicon carbide from the molten solution may be changed. In this instance, as times passes, the molten solution may be maintained with a composition within a predetermined range by adding silicon and carbon according to the composition of the molten solution. The added silicon and carbon may be input continuously or un continually.

When a silicon-based molten composition according to an exemplary embodiment of the present invention is used, a growing speed of the obtained single crystal may be fast, thereby reducing the time and cost used in the process.

Figure 2:
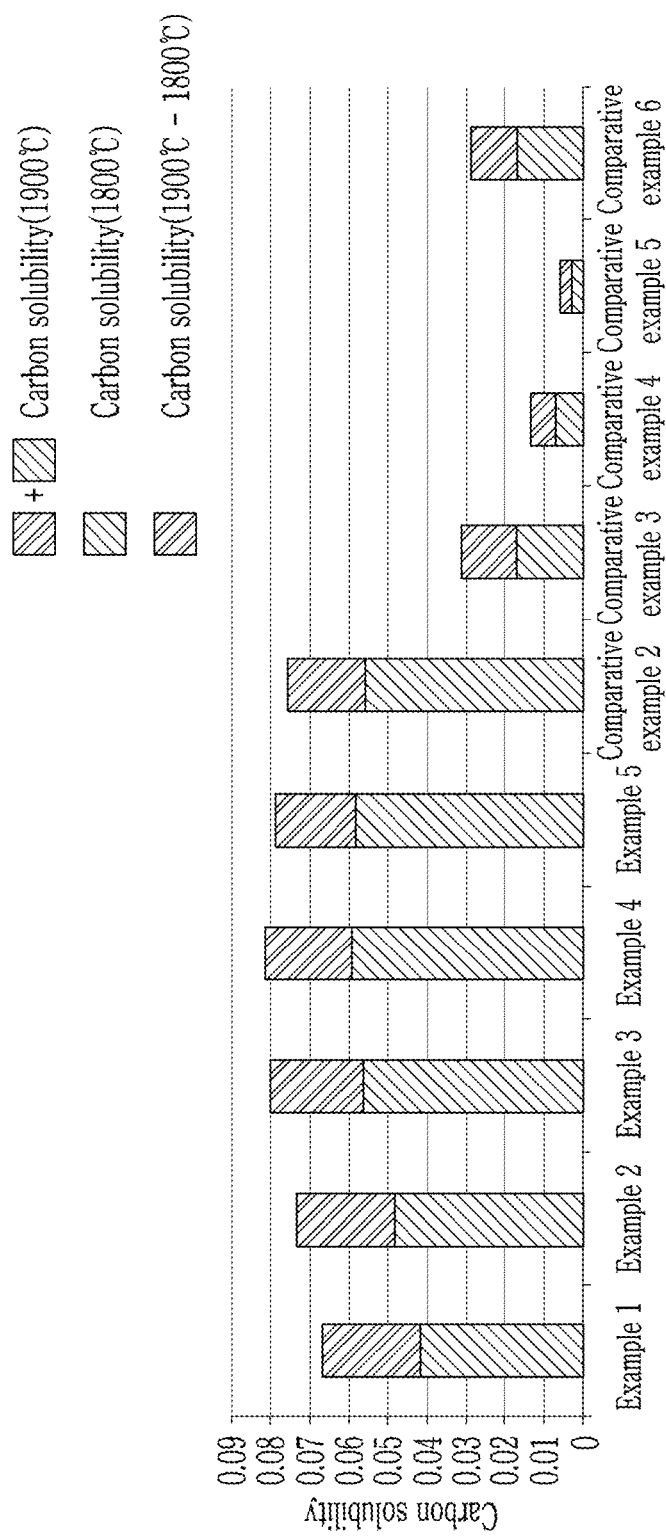
FIG. 2 shows a graph for carbon solubility according to an example and a comparative example.
Figure 3:
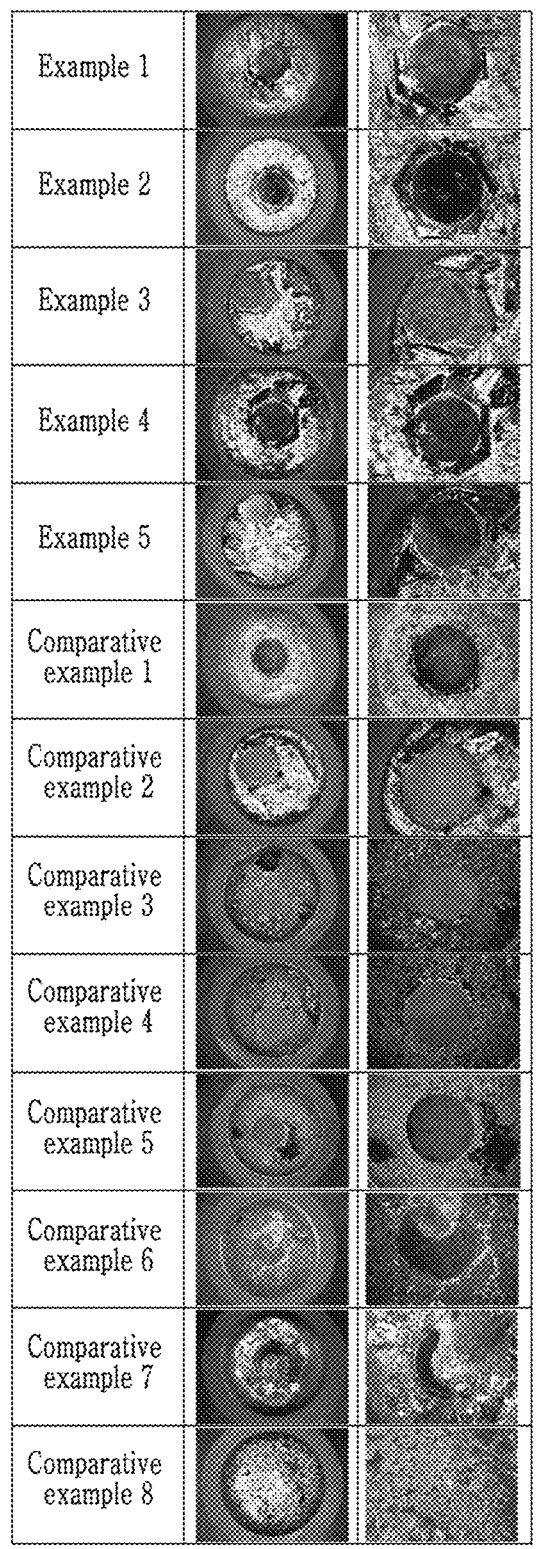
FIG. 3 shows a cross-sectional image of a precipitated coagulation according to an example and a comparative example.
Figure 4:
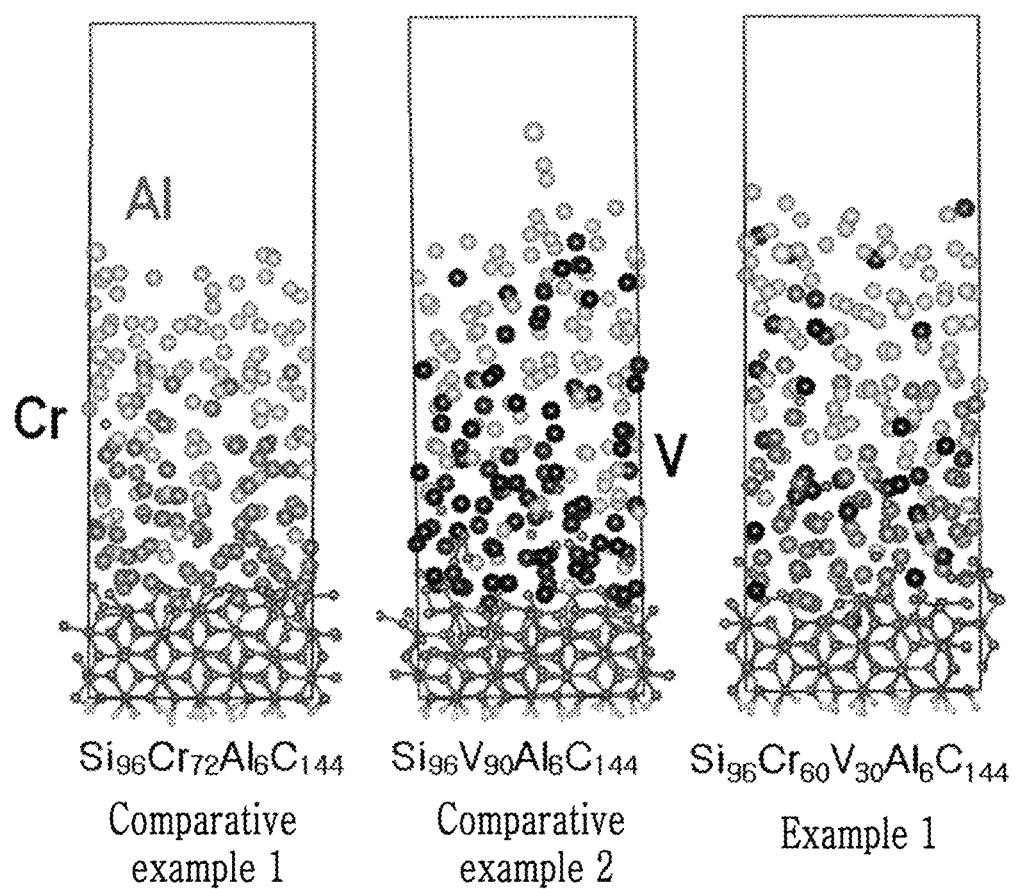
FIG. 4 shows an AIMD simulation image for inspecting carbon solubility according to an example and a comparative example.
Figure 5:
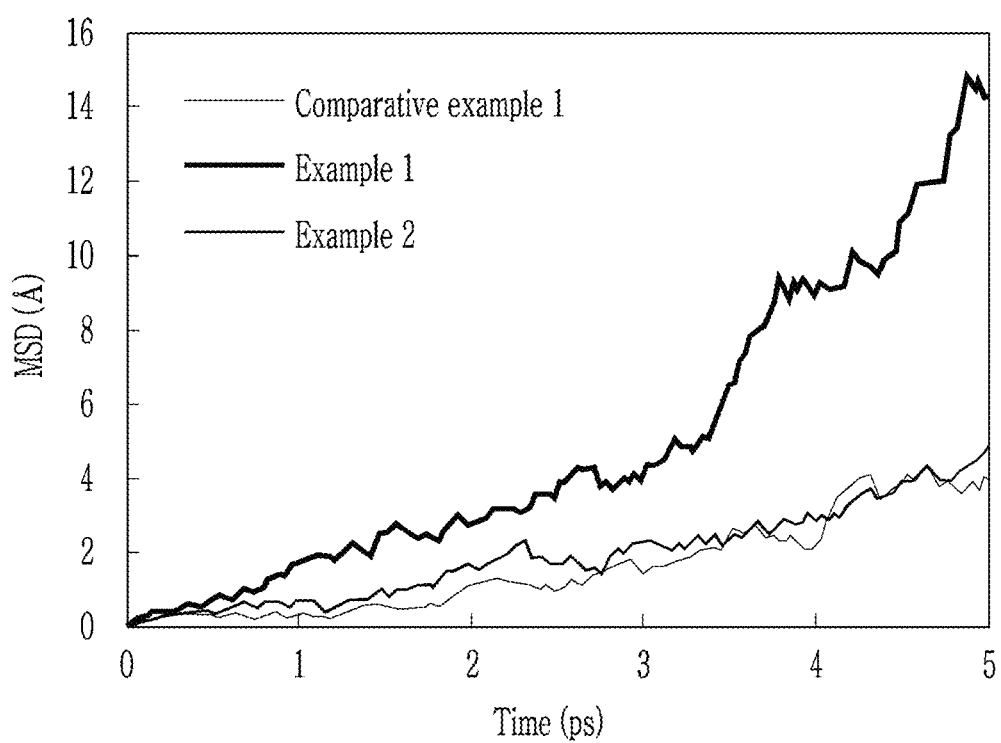
FIG. 5 shows an analysis graph on mean squared displacement (MSD) of carbon atoms according to an example and a comparative example.

An example and a comparative example according to an exemplary embodiment of the present invention will now be described with reference to FIG. 2 through FIG. 5. FIG. 2 shows a graph for carbon solubility according to an example and a comparative example, FIG. 3 shows a cross-sectional image of a precipitated coagulation according to an example and a comparative example, FIG. 4 shows an AIMD simulation image for inspecting carbon solubility according to an example and a comparative example, and FIG. 5 shows an analysis graph of a mean squared displacement (MSD) of carbon atoms according to an example and a comparative example.

Example 1 is $Si_{0.6}(Cr-V)_{0.37}Al_{0.03}$ (Cr:V=9:1), Example 2 is $Si_{0.6}(Cr-V)_{0.37}Al_{0.03}$ (Cr:V=3:1), Example 3 is $Si_{0.6}(Cr-V)_{0.37}Al_{0.03}$ (Cr:V=1:1), Example 4 is $Si_{0.6}(Cr-V)_{0.37}Al_{0.03}$ (Cr:V=1:3), and Example 5 is $Si_{0.6}(Cr-V)_{0.37}Al_{0.03}$ (Cr:V=1:9).

Comparative Example 1 is $Si_{0.6}Cr_{0.37}Al_{0.03}$, Comparative Example 2 is $Si_{0.6}V_{0.37}Al_{0.03}$, Comparative Example 3 is $Si_{0.6}(Cr-Fe)_{0.37}Al_{0.03}$ (Cr:Fe=3:1), Comparative Example 4 is $Si_{0.6}(Cr-Fe)_{0.37}Al_{0.03}$ (Cr:Fe=1:1), Comparative Example 5 is $Si_{0.6}(Cr-Fe)_{0.37}Al_{0.03}$ (Cr:Fe=1:3), Comparative Example 6 is $Si_{0.6}(Cr-V-Fe)_{0.37}Al_{0.03}$ (Cr:V:Fe=1:1:1), Comparative Example 7 is $Si_{0.88}(Cr-V)_{0.08}Al_{0.04}$ (Cr:V=1:1), and Comparative Example 8 is $Si_{0.32}(Cr-V)_{0.64}Al_{0.04}$ (Cr:V=1:1).

FIG. 2 shows a graph for calculating carbon saturated solubility at the temperatures of 1900 degrees (° C.) and 1800 degrees (° C.) and a carbon saturated solubility difference at the temperatures of 1900 degrees (° C.) and 1800 degrees (° C.) regarding the silicon-based molten solution according to Example 1 to Example 5 and Comparative Example 1 to Comparative Example 6, using a thermodynamic calculating program that is FactSage (SGTE database). The carbon solubility represents a ratio of a number of moles of dissolved carbon vs. an entire number of moles of the silicon-based molten solution including the dissolved carbon.

As shown in FIG. 2, in the case of the silicon-based molten composition according to Example 1 to Example 5 vs. Comparative Example 2 to Comparative Example 6, it is determined that carbon saturated solubility at the temperatures of 1900 degrees (° C.) and 1800 degrees (° C.) and a carbon saturated solubility difference at the temperatures of 1900 degrees (° C.) and 1800 degrees (° C.) are great.

It is determined that the silicon-based molten composition according to an example including chromium and vanadium has greater carbon solubility than a comparative example using vanadium, a comparative example including chromium and iron, and a comparative example including chromium, vanadium, and iron.

In detail, in the case of the silicon-based molten composition including chromium, the carbon solubility difference caused by the temperature may be great. The silicon-based molten composition including vanadium may have a great carbon solubility value at the corresponding temperatures. The carbon included in the silicon-based molten composition including vanadium may have stable energy, so the carbon included by the crucible may be a large amount that is eluted as a silicon-based molten composition. Therefore, in the case of the silicon-based molten composition including chromium and vanadium according to the present example, the carbon solubility value at the corresponding temperature as well as the carbon solubility difference caused by the temperature difference are large.

FIG. 3 shows an image of precipitated coagulation by annealing according to Example 2 to Example 4 and Comparative Example 1 to Comparative Example 8.

To obtain the coagulation, initial base materials corresponding to chemical compositions of the comparative examples and examples are input to a graphite crucible. The SiC seed crystal (ϕ10 mm) is provided on an upper portion of the crucible, it is fused for two hours at 1900 degrees (° C.), it is cooled to 1600 degrees (° C.) at a rate of 1 degree (° C.) per minute, and it is quenched to thus obtain coagulation (SiC single crystal).

A small amount of hexagonal silicon carbide single crystal is precipitated from the seed crystal in Comparative Examples 1 and 2, and a scarce or very small amount of hexagonal silicon carbide deposition is found from the seed crystal in Comparative Examples 3 to 6.

Comparative Example 7 shows a case when the content (b+c) of chromium and vanadium is less than 0.1. Comparative Example 7 has a large content of silicon compared to exemplary embodiments, so it has a characteristic of silicon of which the volume expands when it is coagulated. As shown in FIG. 3, when the molten solution is coagulated, a spherical protrusion that is upwardly convex in a center of the crucible may be generated. The protrusion covers most of the silicon carbide seed crystal, and when the partly exposed silicon carbide seed crystal is inspected, it is found that the silicon carbide single crystal does not grow. That is, it is determined that the content of chromium and vanadium included in the molten solution is very much less and it is not sufficient for the silicon carbide to grow.

Further, Comparative Example 8 represents a case in which the content (b+c) of chromium and vanadium is greater than 0.6. In this instance, it may be determined that the silicon carbide seed crystal has disappeared after the process is finished. It is determined that the chemical activity of SiC included by the silicon carbide seed crystal is less than the carbon included by the crucible, and the metal included in the molten solution dissolves not the carbon of the crucible but the silicon carbide seed crystal.

On the contrary, precipitation of a large hexagonal silicon carbide crystal around the seed crystal is observed in Example 1 to Example 5. It is determined through FIG. 3 that precipitation of the silicon carbide single crystal according to exemplary embodiments is better than that according to the comparative example.

FIG. 4 and FIG. 5 will now be described. FIG. 4 shows an AIMD simulation image for inspecting carbon solubility of Comparative Example 1, Comparative Example 2, and Example 1, and FIG. 5 shows an analysis graph of a mean squared displacement (MSD) of carbon atoms according to Comparative Example 1, Comparative Example 2, and Example 1.

For an analysis of the characteristic on carbon solubility, FIG. 4 and FIG. 5 are induced by optimizing interface models according to Comparative Example 1, Comparative Example 2, and Example 1 with a density functional theory (DFT), and performing a mean squared displacement (MSD) simulation on carbon using ab initio molecular dynamics (AIMD). AIMD calculation is performed for a short time of 5 ps at 4000 K so as to observe movement and changes of carbon atoms.

It is determined that the carbon atoms of the lower portion of the graphite are diffused into the silicon-based molten solution after 5 ps has passed according to simulation results on the compositions of Comparative Example 1, Comparative Example 2, and Example 1. Particularly, it is determined that the diffusion degree of carbon atoms is the most remarkable in Example 1, and the carbon atoms are diffused at similar low levels in Comparative Example 2 and Comparative Example 1.

As shown in FIG. 5, it is also determined, compared to Comparative Example 1 and Comparative Example 2, that the mean squared displacement (MSD) value of the carbon atom is high in Example 1. The silicon-based molten composition including chromium and vanadium may have greater carbon solubility than the comparative example using chromium or vanadium, and the crystal growing speed may be improved.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: chamber
210: seed crystal

What is claimed is:

1. A silicon-based molten composition for use in a solution growing method for forming silicon carbide single crystal, comprising: silicon (Si), chromium (Cr), vanadium (V) and aluminum (Al) as expressed in Formula 1:

$$Si_a Cr_b V_c Al_d \quad \text{[Formula 1]}$$

wherein, in Formula 1, a is equal to or greater than 0.4 and equal to or less than 0.9, b+c is equal to or greater than 0.1 and equal to or less than 0.6, c/(b+c) is equal to or greater than 0.05 and equal to or less than 0.95, and d is equal to or greater than 0.01 and equal to or less than 0.1.

2. The silicon-based molten composition of claim 1, wherein,
in Formula 1, a is equal to or greater than 0.5 and equal to or less than 0.8, b+c is equal to or greater than 0.2 and equal to or less than 0.5, c/(b+c) is equal to or greater than 0.1 and equal to or less than 0.9, and d is equal to or greater than 0.01 and equal to or less than 0.05.

3. The silicon-based molten composition of claim 1, wherein
the silicon-based molten composition has carbon solubility that is equal to or greater than 0.04 at a temperature of 1800 degrees (° C.).

4. The silicon-based molten composition of claim 1, wherein
the silicon-based molten composition has carbon solubility that is equal to or greater than 0.06 at a temperature of 1900 degrees (° C.).

5. The silicon-based molten composition of claim 1, wherein
a content ratio of the chromium and the vanadium is 9:1 to 1:9.

6. A method for manufacturing a silicon carbide single crystal comprising:
preparing a silicon carbide seed crystal;
preparing a silicon-based molten composition comprising silicon (Si), chromium (Cr), vanadium (V), and aluminum (Al), as expressed in Formula 1;
forming a molten solution by adding carbon (C) to the silicon-based molten composition; and
growing the silicon carbide single crystal on the seed crystal by overcooling the molten solution:

$$Si_a Cr_b V_c Al_d \quad \text{[Formula 1]}$$

wherein, in Formula 1, a is equal to or greater than 0.4 and equal to or less than 0.9, b+c is equal to or greater than 0.1 and equal to or less than 0.6, c/(b+c) is equal to or greater than 0.05 and equal to or less than 0.95, and d is equal to or greater than 0.01 and equal to or less than 0.1.

7. The method of claim 6, wherein,
in Formula 1, a is equal to or greater than 0.5 and equal to or less than 0.8, b+c is equal to or greater than 0.2 and equal to or less than 0.5, c/(b+c) is equal to or greater than 0.1 and equal to or less than 0.9, and d is equal to or greater than 0.01 and equal to or less than 0.05.

8. The method of claim 6, wherein
the silicon-based molten composition has carbon solubility that is equal to or greater than 0.04 at the temperature of 1800 degrees (° C.).

9. The method of claim 6, wherein the silicon-based molten composition has carbon solubility that is equal to or greater than 0.06 at the temperature of 1900 degrees (° C.).

10. The method of claim 6, wherein
a content ratio of the chromium and the vanadium is 9:1 to 1:9.

* * * * *